United States Patent
Cheng et al.

(10) Patent No.: US 10,079,352 B2
(45) Date of Patent: Sep. 18, 2018

(54) FLEXIBLE DISPLAY DEVICE AND MANUFACTURING METHOD FOR FLEXIBLE DEVICE

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Leilei Cheng, Beijing (CN); Yuankui Ding, Beijing (CN); Dongfang Wang, Beijing (CN); Ce Zhao, Beijing (CN)

(73) Assignees: BOE Technology Group Co., Ltd., Beijing (CN); Hefei Xinsheng Optoelectronics Technology Co., Ltd., Hefei (CN)

(*) Notice: Subject to any disclaimer, the term of this patent is extended or adjusted under 35 U.S.C. 154(b) by 0 days.

(21) Appl. No.: 15/201,790

(22) Filed: Jul. 5, 2016

(65) Prior Publication Data

US 2017/0207402 A1   Jul. 20, 2017

(30) Foreign Application Priority Data

Jan. 18, 2016 (CN) .......................... 2016 1 0032487

(51) Int. Cl.
*H01L 29/08* (2006.01)
*H01L 35/24* (2006.01)
(Continued)

(52) U.S. Cl.
CPC ...... *H01L 51/0097* (2013.01); *H01L 27/3244* (2013.01); *H01L 51/56* (2013.01); *H01L 2227/323* (2013.01); *H01L 2251/5338* (2013.01)

(58) Field of Classification Search
CPC ....... H01L 2251/5338; H01L 2227/326; H01L 51/003; H01L 51/009; H01L 27/3244; H01L 51/56; H01L 2227/323; H05K 1/185
(Continued)

(56) References Cited

U.S. PATENT DOCUMENTS

| 5,661,092 A * | 8/1997 | Koberstein ............ B05D 1/208 427/226 |
| 2011/0052836 A1* | 3/2011 | Kim ........................ H01L 51/52 428/1.1 |

(Continued)

FOREIGN PATENT DOCUMENTS

| CN | 101475177 | 7/2009 |
| CN | 102636898 | 8/2012 |

(Continued)

*Primary Examiner* — Thao X Le
*Assistant Examiner* — Nduka Ojeh
(74) *Attorney, Agent, or Firm* — Harness, Dickey & Pierce, P.L.C.

(57) ABSTRACT

Embodiments of the present disclosure provide a manufacturing method for a flexible device and a flexible display device. The manufacturing method for a flexible device comprises: step S1, forming an organosiloxane layer on a supporting substrate; step S2, forming a flexible substrate on the organosiloxane layer; step S3, forming a display device on the flexible substrate; step S4, performing an oxidation treatment on a surface of the organosiloxane layer that contacts the supporting substrate such that a silicon dioxide layer is formed between the organosiloxane layer and the supporting substrate; and step S5, peeling off the supporting substrate from the silicon dioxide layer.

8 Claims, 3 Drawing Sheets

(51) Int. Cl.
*H01L 51/00* (2006.01)
*H01L 21/00* (2006.01)
*H05K 1/00* (2006.01)
*H01L 27/32* (2006.01)
*H01L 51/56* (2006.01)

(58) Field of Classification Search
USPC .................. 257/40, 59, 72; 438/28; 361/749
See application file for complete search history.

(56) References Cited

U.S. PATENT DOCUMENTS

| | | | |
|---|---|---|---|
| 2012/0224264 A1* | 9/2012 | Chiba | B29D 11/00346 359/573 |
| 2014/0362545 A1* | 12/2014 | Tsai | H05K 3/007 361/749 |
| 2015/0192819 A1* | 7/2015 | Koo | G02F 1/133305 349/158 |
| 2017/0213975 A1* | 7/2017 | Cheng | H01L 51/0012 |

FOREIGN PATENT DOCUMENTS

| | | |
|---|---|---|
| CN | 102769109 | 11/2012 |
| CN | 103872069 | 6/2014 |
| CN | 104241322 | 12/2014 |
| CN | 104507266 | 4/2015 |
| CN | 104752487 | 7/2015 |
| CN | 205319158 | 6/2016 |
| EP | 2840460 | 2/2015 |
| EP | 2894672 | 7/2015 |

* cited by examiner

FLEXIBLE DISPLAY DEVICE AND MANUFACTURING METHOD FOR FLEXIBLE DEVICE

CROSS-REFERENCE TO RELATED APPLICATION

This application claims the benefit and priority of Chinese Patent Application No. 201610032487.0 filed Jan. 18, 2016. The entire disclosure of the above application is incorporated herein by reference.

FIELD

The present disclosure relates to a manufacturing method for a flexible device and a flexible display device.

BACKGROUND

This section provides background information related to the present disclosure which is not necessarily prior art.

Flexible display devices have attracted more and more extensive attention and found more and more applications in recent years with the development of the display technology. During the process of preparing a flexible display substrate, a flat supporting substrate with a certain mechanical strength is often necessary to ensure the flatness of various layers and the alignment therebetween. A flexible substrate is adhered to the supporting substrate, then films of a TFT device are formed on the flexible substrate so as to form the flexible display substrate, and finally the flexible display substrate is peeled off from the supporting substrate. However, during the process of peeling off the flexible display substrate, slight deformation of the flexible substrate tends to occur, which would result in adverse effects such as dislocation of wirings of electronic components, low yield and so on. Therefore, the cost of the flexible display device will increase.

For example, in the prior art, the flexible display substrate is usually peeled off from one side or bottom of the supporting substrate by using laser technology. However, the display components are likely to be damaged during the process of peeling due to the fact that the films in the flexible display substrate are thin, the energy of the laser light is high, or the like, which increases the cost of the flexible display apparatuses.

Furthermore, in the prior art, the thermal expansion coefficient of the flexible substrate is lowered by modifying the flexible substrate, for example, by implanting ions into the surface of the flexible substrate using ion implantation technology, in order to alleviate the problems of warping and pattern displacement of the flexible display substrate. However, this would cause a problem that the processes for preparing the flexible display substrate are relatively complicated because it is necessary to use high implantation energy to modify the flexible substrate.

SUMMARY

This section provides a general summary of the disclosure, and is not a comprehensive disclosure of its full scope or all of its features.

Embodiments of the present disclosure provide a manufacturing method for a flexible device and a flexible display device, which are simple, low-cost, and can improve the capability for shielding against water and oxygen, the strength and the thermostability of the flexible substrate.

An aspect of the embodiments of the present disclosure provides a manufacturing method for a flexible device, comprising:

step S1, forming an organosiloxane layer on a supporting substrate;

step S2, forming a flexible substrate on the organosiloxane layer;

step S3, forming a display device on the flexible substrate;

step S4, performing an oxidation treatment on a surface of the organosiloxane layer that contacts the supporting substrate such that a silicon dioxide layer is formed between the organosiloxane layer and the supporting substrate; and step S5, peeling off the supporting substrate from the silicon dioxide layer.

In an exemplary embodiment, the manufacturing method further comprises, after completing step S4 and before performing step S5, a step of curing the silicon dioxide layer.

In an exemplary embodiment, the manufacturing method further comprises, after completing step S2 and before performing step S3, a step of curing the flexible substrate and the organosiloxane layer.

In an exemplary embodiment, the organosiloxane layer is formed by a coating or spin-coating process in step S1.

In an exemplary embodiment, the supporting substrate is formed of transparent material; and the oxidation treatment in step S4 is performed by irradiating the surface of the organosiloxane layer that contacts the supporting substrate with ultra-violet ray or ozone through the supporting substrate.

In an exemplary embodiment, the transparent material comprises glass.

In an exemplary embodiment, step S3 further comprises:

step S31, forming a TFT device on the flexible substrate;

step S32, forming an organic light-emitting material layer on the TFT device; and step S33, forming a protective packaging layer on the organic light-emitting material layer.

In an exemplary embodiment, the organosiloxane layer comprises polydimethylsiloxane.

In an exemplary embodiment, the flexible substrate comprises polyimide or poly (ethylene naphthalate).

Another aspect of the embodiments of the present disclosure provides a flexible display device comprising a flexible substrate, a display device provided on the flexible substrate, an organosiloxane layer provided on a surface of the flexible substrate that faces away from the display device, and a silicon dioxide layer provided on a surface of the organosiloxane layer that faces away from the flexible substrate.

In an exemplary embodiment, the silicon dioxide layer is a cured layer.

In an exemplary embodiment, the flexible substrate and the organosiloxane layer are cured layers.

In an exemplary embodiment, the display device comprises a TFT device provided on the flexible substrate, an organic light-emitting material layer provided on the TFT device and a protective packaging layer provided on the organic light-emitting material layer.

In an exemplary embodiment, the organosiloxane layer comprises polydimethylsiloxane.

In an exemplary embodiment, the flexible substrate comprises polyimide or poly (ethylene naphthalate).

In the manufacturing method for a flexible device provided by an aspect of the embodiments of the present disclosure, an organosiloxane layer, a flexible substrate and a display device are formed on a supporting substrate, and then an oxidation treatment is performed on a surface of the organosiloxane layer that contacts the supporting substrate to form a silicon dioxide layer between the organosiloxane layer and the supporting substrate. The silicon dioxide layer can decrease the bonding strength between the flexible substrate and the supporting substrate such that the supporting substrate can be peeled off more easily. Therefore, the risk that the flexible device is damaged can be reduced, and yield is improved. Furthermore, the silicon dioxide has a function of shielding against water vapor, and can enhance the strength and stability of the flexible substrate. The manufacturing method for the flexible device provided by an aspect of the present disclosure can reduce the risk that the flexible device is damaged and improve the yield by performing the oxidation treatment on the surface of the organosiloxane layer that contacts the supporting substrate, and accordingly the method is simple and low cost.

In the flexible display device provided by another aspect of the embodiments of the present disclosure, an organosiloxane layer is provided on a surface of a flexible substrate that faces away from the display device, and a silicon dioxide layer is provided on a surface of the organosiloxane layer that faces away from the flexible substrate. The silicon dioxide layer can decrease the bonding strength between the flexible substrate and the supporting substrate such that the supporting substrate can be peeled off more easily. Therefore, the risk that the flexible device is damaged can be reduced, and yield is improved. Furthermore, the silicon dioxide has a function of shielding against water vapor, and can enhance the strength and stability of the flexible substrate.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 3:
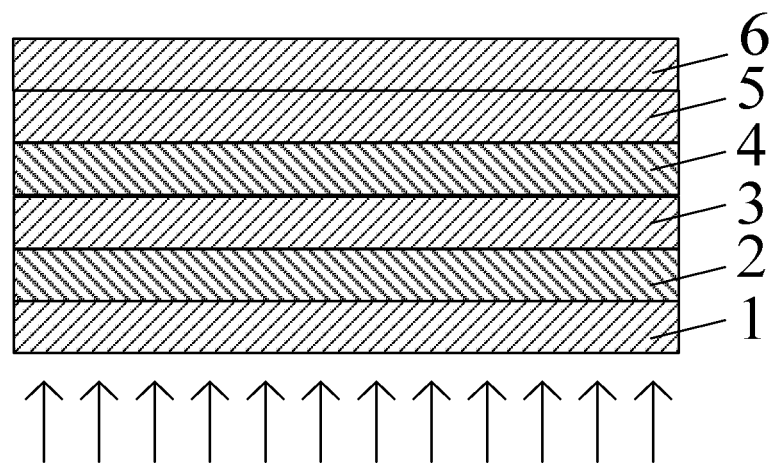
Figure 4:
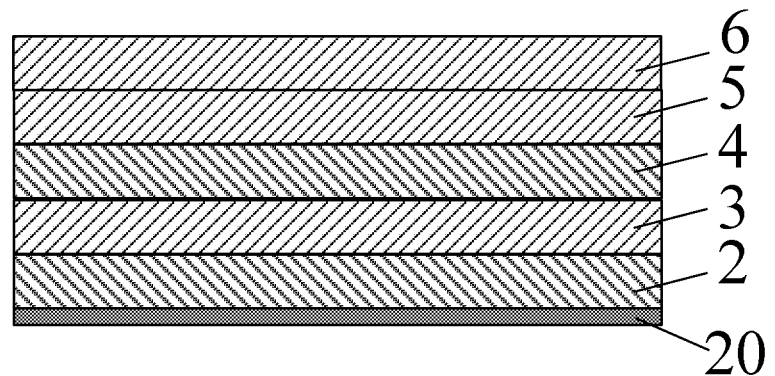
Figure 5:
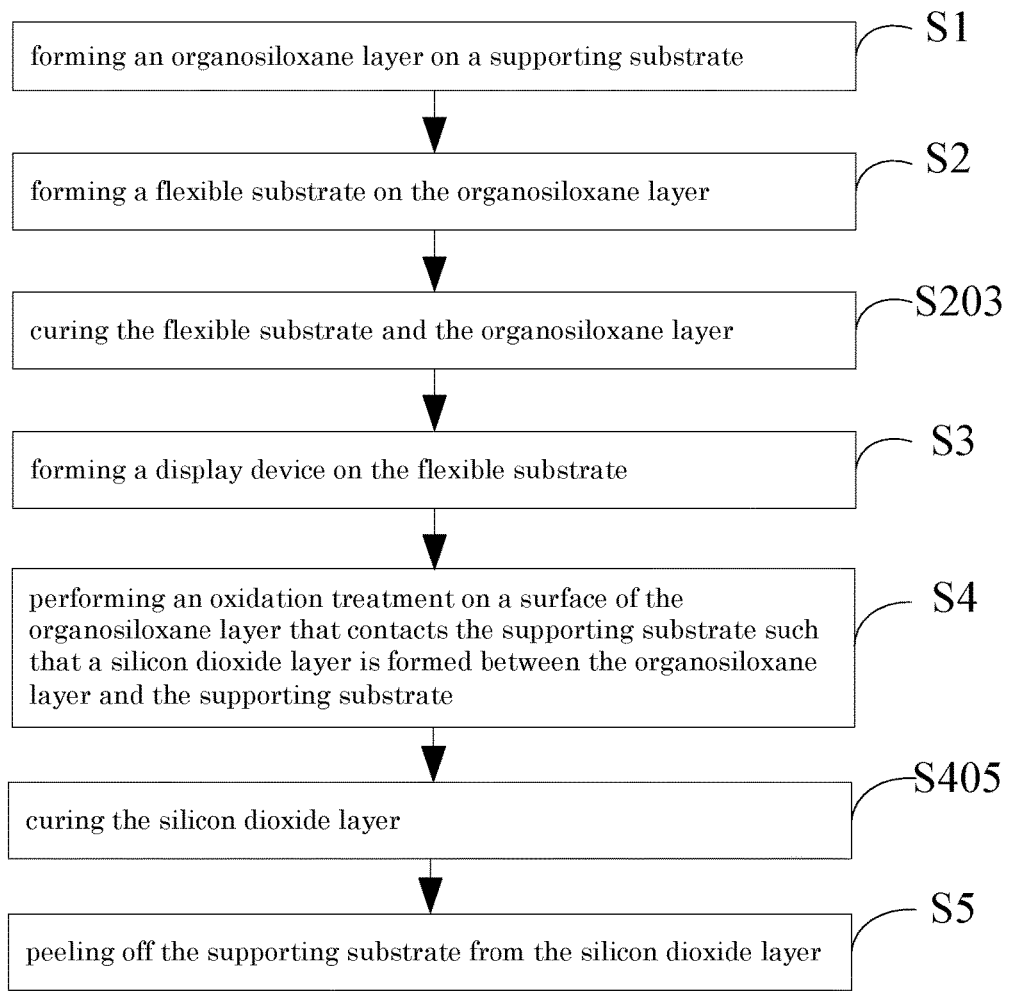

FIG. 3 schematically illustrates the process during which step S4 is performed;

FIG. 4 is a cross-section view of the flexible device after completing step S5 according the first embodiment; and FIG. 5 is a flow chart illustrating a manufacturing method for a flexible device provided by a second embodiment of the present disclosure.

Corresponding reference numerals indicate corresponding parts or features throughout the several views of the drawings.

DETAILED DESCRIPTION

Example embodiments will now be described more fully with reference to the accompanying drawings.

In the description of the present disclosure, it is to be noted that the oriental or positional relationships indicated by the terms "upper", "lower", "top", "bottom" and the like are the oriental or positional relationships shown in the drawings, they are used only for the purpose of description and simplifying the description rather than indicating or suggesting that the device or element indicated must be in a specific orientation, be structured and operated in a specific orientation, and therefore they shall not be deemed to limit the scope of the present disclosure.

Figure 1:
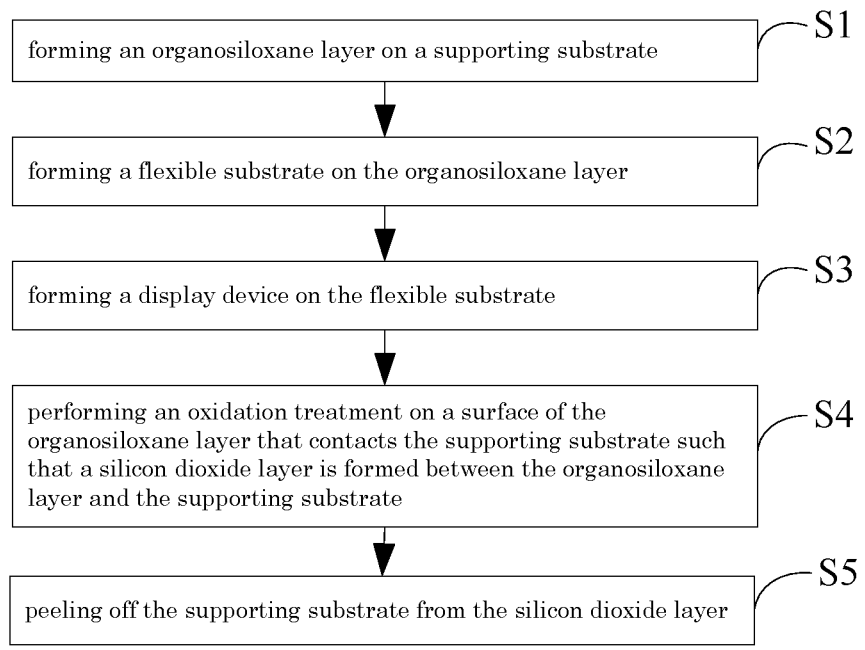
FIG. 1 is a flow chart illustrating a manufacturing method for a flexible device provided by a first embodiment of the present disclosure.

FIG. 1 is a flow chart illustrating a manufacturing method for a flexible device provided by a first embodiment of the present disclosure. Referring to FIG. 1, the manufacturing method for the flexible device comprises:

step S1, forming an organosiloxane layer on a supporting substrate;

step S2, forming a flexible substrate on the organosiloxane layer;

step S3, forming a display device on the flexible substrate;

step S4, performing an oxidation treatment on a surface of the organosiloxane layer that contacts the supporting substrate such that a silicon dioxide layer is formed between the organosiloxane layer and the supporting substrate; and step S5, peeling off the supporting substrate from the silicon dioxide layer.

The organosiloxane layer may be formed by a coating or spin-coating process in step S1. The organosiloxane layer may comprise polydimethylsiloxane that has good electrical insulating property and high-and-low temperature resistance and can be long-term used under a temperature condition of −50~+250° C. Polydimethylsiloxane also has advantages of high compressibility, low surface tension, good hydrophobic moisture resistance, and etc. Furthermore, polydimethylsiloxane in fluid state can be formed into a smooth and homogeneous coating layer due to its characteristic of low surface tension. Polydimethylsiloxane may be properly modified as required in practical applications.

Moreover, in the present embodiment, a transparent material such as glass may be used to form the supporting substrate such that UV light or ozone can irradiate a surface of the organosiloxane layer that contacts the supporting substrate through the supporting substrate.

The flexible substrate may comprise a polymer substrate such as polyimide or poly (ethylene naphthalate) substrate or the like in step S2.

Step S3 may further comprise:

step S31, forming a TFT device on the flexible substrate;

step S32, forming an organic light-emitting material layer on the TFT device; and step S33, forming a protective packaging layer on the organic light-emitting material layer.

Figure 2:
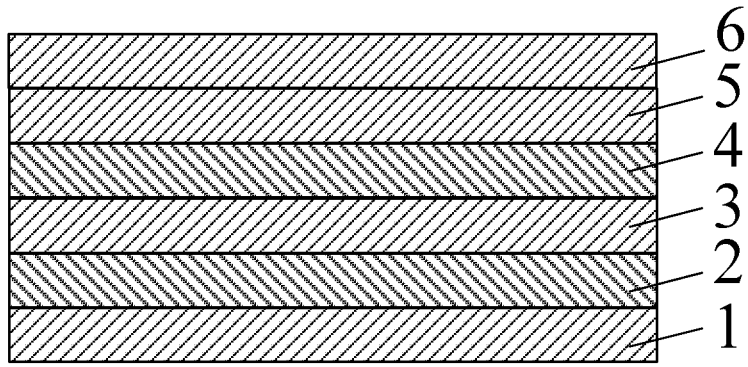
FIG. 2 is a cross-section view of the flexible device after completing step S3 according the first embodiment.

FIG. 2 is a cross-section view of the flexible device after completing step S3 according the first embodiment. As shown in FIG. 2, after completing step S33, an organosiloxane layer 2, a flexible substrate 3 and a display device are arranged on a supporting substrate 1 in this order. The display device comprises a TFT device 4, an organic light-emitting material layer 5 and a protective packaging layer 6. In practical applications, the display device may comprise other kinds of layers according to specific needs.

FIG. 3 schematically illustrates the process during which step S4 is performed. As shown in FIG. 3, in step S4, the oxidation treatment may be performed by irradiating the surface of the organosiloxane layer 2 that contacts the supporting substrate 1 with ultra-violet ray or ozone (i.e., the lower surface of the organosiloxane layer 2 in FIG. 3) through the supporting substrate 1. The irradiation direction of the ultra-violet ray or ozone is shown by the arrows in FIG. 3.

FIG. 4 is a cross-section view of the flexible device after completing step S5 according the first embodiment. As shown in FIG. 4, after completing step S4, a silicon dioxide layer 20 is formed between the organosiloxane layer 2 and the supporting substrate 1. Then, the supporting substrate 1 is peeled off from the silicon dioxide layer 20. The silicon dioxide layer 20 can weaken the binding strength between the flexible substrate 3 and the supporting substrate 1 and serves as a transition layer therebetween, so the supporting substrate 1 can be peeled off more easily. The risk that the flexible device is damaged can be reduced and the yield can be improved. Furthermore, the silicon dioxide layer 20 can shield against water vapor as well as enhance the strength and stability of the flexible substrate. The manufacturing method for the flexible device provided by the first embodiment of the present disclosure can reduce the risk that the flexible device is damaged and improve the yield by performing the oxidation treatment on the surface of the organosiloxane layer 2 that contacts the supporting substrate 1, and accordingly the method is simple and low cost.

It is to be noted that although the oxidation treatment is performed by irradiating the surface of the organosiloxane layer 2 that contacts the support substrate 1 with ultra-violet ray or ozone in the present embodiment, the present disclosure is not limited thereto. In practical applications, any other oxidation treatment may be used as long as a silicon dioxide layer can be formed between the organosiloxane layer and the supporting substrate.

FIG. 5 is a flow chart illustrating a manufacturing method for a flexible device provided by a second embodiment of the present disclosure. Referring to FIG. 5, it can be seen that the manufacturing method for a flexible device provided by the present embodiment is different from that provided by the first embodiment in that the silicon dioxide layer is cured and/or the flexible substrate and the organosiloxane layer are cured.

Specifically, the manufacturing method for the flexible device of the present embodiment may further comprise, after forming the flexible substrate on the organosiloxane layer (step S2) and before forming the display device on the flexible substrate (step S3): step S203, the flexible substrate and the organosiloxane layer are cured.

Additionally or alternatively, the manufacturing method for the flexible device of the present embodiment may further comprise, after performing the oxidation treatment on the surface of the organosiloxane layer that contacts the supporting substrate such that a silicon dioxide layer is formed between the organosiloxane layer and supporting substrate (step S4) and before peeling off the support substrate from the silicon dioxide layer (step S5): step S405, the silicon dioxide layer is cured.

In the manufacturing method for the flexible device shown in FIG. 5, both the step of curing the flexible substrate and the organosiloxane layer (step 203) and the step of curing the silicon dioxide layer (step 405) are shown. However, FIG. 5 is just an schematic diagram, and as described before, the manufacturing method for the flexible device of the present embodiment may comprise at least one of the step of curing the flexible substrate and the organosiloxane layer (step 203) and the step of curing the silicon dioxide layer (step 405).

In step 203, the flexible substrate and the organosiloxane layer can be cured and shaped and finally integrated, by performing curing treatment (preferably, low temperature treatment) on them.

In step 405, by curing the silicon dioxide layer, the hardness of the organosiloxane layer can be increased.

Other steps of the present embodiment are identical with those in the technical solution of the first embodiment and will not be repeated herein.

Another aspect of the embodiments of the present disclosure provides a flexible display device. As shown in FIG. 4, the flexible display device comprises a flexible substrate 3, a display device provided on the flexible substrate 3, an organosiloxane layer 2 provided on a surface of the flexible substrate 3 that faces away from the display device, and a silicon dioxide layer 20 provided on a surface of the organosiloxane layer 2 that faces away from the flexible substrate.

In an exemplary embodiment, the silicon dioxide layer 20 is a cured layer and thereby the hardness of the organosiloxane layer 2 can be increased.

In an exemplary embodiment, the flexible substrate 3 and the organosiloxane layer 2 are cured layers, and they are shaped and finally integrated through curing treatment (preferably, low temperature treatment).

In an exemplary embodiment, the display device comprises a TFT device 4 provided on the flexible substrate 3, an organic light-emitting material layer 5 provided on the TFT device 4, and a protective packaging layer 6 provided on the organic light-emitting material layer 5. In practical applications, the display device may comprise other kinds of layers according to specific needs.

In an exemplary embodiment, the organosiloxane layer may comprise polydimethylsiloxane that has good electrical insulating property and high-and-low temperature resistance, and can be long-term used under a temperature condition of −50~+250° C. Polydimethylsiloxane also has advantages of high compressibility, low surface tension, good hydrophobic moisture resistance, and etc. Furthermore, polydimethylsiloxane in fluid state can be formed into a smooth and homogeneous coating layer due to its characteristic of low surface tension. Polydimethylsiloxane may be properly modified as required in practical applications.

In an exemplary embodiment, the flexible substrate may comprise a polymer substrate such as polyimide or poly (ethylene naphthalate) substrate or the like.

In summary, in the flexible display device provided by another aspect of the embodiments of the present disclosure, the organosiloxane layer is provided on the surface of the flexible substrate that faces away from the display device, and a silicon dioxide layer is provided on the surface of the organosiloxane layer that faces away from the flexible substrate. The silicon dioxide layer can decrease the bonding strength between the flexible substrate and the supporting substrate such that the supporting substrate can be peeled off more easily. Therefore, the risk that the flexible device is damaged can be reduced, and yield is improved. Furthermore, the silicon dioxide has a function of shielding against water vapor, and can enhance the strength and stability of the flexible substrate.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A manufacturing method for a flexible device, the method comprising:
    forming an organosiloxane layer on a supporting substrate;
    forming a flexible substrate on the organosiloxane layer;
    after completing formation of the flexible substrate, curing the flexible substrate and the organosiloxane layer by performing a low temperature treatment on the flexible substrate and the organosiloxane layer;
    after curing the flexible substrate and the organosiloxane layer, forming a display device on the flexible substrate;
    performing an oxidation treatment on a surface of the organosiloxane layer that contacts the supporting substrate to form a silicon dioxide layer between the organosiloxane layer and the supporting substrate; and
    peeling off the supporting substrate from the silicon dioxide layer formed by the oxidation treatment.

2. The manufacturing method for a flexible device according to claim 1, further comprising, after completing performing the oxidation treatment and before peeling off the supporting substrate, curing the silicon dioxide layer.

3. The manufacturing method for a flexible device according to claim 1, wherein the organosiloxane layer is formed by a coating or spin-coating process.

4. The manufacturing method for a flexible device according to claim 1, wherein the supporting substrate is formed of transparent material; and
    the oxidation treatment is performed by irradiating the surface of the organosiloxane layer that contacts the supporting substrate with an ultra-violet ray or ozone through the supporting substrate.

5. The manufacturing method for a flexible device according to claim 4, wherein the transparent material comprises glass.

6. The manufacturing method for a flexible device according to claim 1, wherein forming the display device further comprises:
    forming a TFT device on the flexible substrate;
    forming an organic light-emitting material layer on the TFT device; and
    forming a protective packaging layer on the organic light-emitting material layer.

7. The manufacturing method for a flexible device according to claim 1, wherein the organosiloxane layer comprises polydimethylsiloxane.

8. The manufacturing method for a flexible device according to claim 1, wherein the flexible substrate comprises polyimide or polyethylene naphthalate.

* * * * *